US008673696B2

(12) United States Patent
Baars et al.

(10) Patent No.: US 8,673,696 B2
(45) Date of Patent: Mar. 18, 2014

(54) SOI SEMICONDUCTOR DEVICE COMPRISING A SUBSTRATE DIODE WITH REDUCED METAL SILICIDE LEAKAGE

(75) Inventors: Peter Baars, Dresden (DE); Frank Jakubowski, Dresden (DE); Jens Heinrich, Wachau (DE); Marco Lepper, Dresden (DE); Jana Schlott, Wachau (DE); Kai Frohberg, Niederau (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 100 days.

(21) Appl. No.: 13/397,345

(22) Filed: Feb. 15, 2012

(65) Prior Publication Data

US 2012/0217582 A1 Aug. 30, 2012

(30) Foreign Application Priority Data

Feb. 24, 2011 (DE) .......................... 10 2011 004 672

(51) Int. Cl.
*H01L 21/00* (2006.01)
*H01L 21/425* (2006.01)
*H01L 21/44* (2006.01)

(52) U.S. Cl.
USPC ............................ 438/149; 438/517; 438/682

(58) Field of Classification Search
None
See application file for complete search history.

(56) References Cited

U.S. PATENT DOCUMENTS 6,407,429 B1  6/2002  Ko et al. ....................... 257/350
7,943,442 B2  5/2011  Gehring et al. ............... 438/152

FOREIGN PATENT DOCUMENTS

DE   102007004859 A1   8/2008 ............ H01L 21/822

OTHER PUBLICATIONS

Translation of Official Communication from German Patent Office for German Patent Application No. 10 2011 004 672.0 dated Dec. 19, 2011.

*Primary Examiner* — Scott B Geyer
(74) *Attorney, Agent, or Firm* — Amerson Law Firm, PLLC

(57) ABSTRACT

When forming substrate diodes in SOI devices, superior diode characteristics may be preserved by providing an additional spacer element in the substrate opening and/or by using a superior contact patterning regime on the basis of a sacrificial fill material. In both cases, integrity of a metal silicide in the substrate diode may be preserved, thereby avoiding undue deviations from the desired ideal diode characteristics. In some illustrative embodiments, the superior diode characteristics may be achieved without requiring any additional lithography step.

17 Claims, 13 Drawing Sheets

SOI SEMICONDUCTOR DEVICE COMPRISING A SUBSTRATE DIODE WITH REDUCED METAL SILICIDE LEAKAGE

BACKGROUND OF THE INVENTION

1. Field of the Invention

Generally, the present disclosure relates to integrated circuits, and, more particularly, to SOI semiconductor devices comprising substrate diodes that are formed in the crystalline material of the substrate.

2. Description of the Related Art

The fabrication of integrated circuits requires a large number of circuit elements, such as transistors and the like, to be formed on a given chip area according to a specified circuit layout. Generally, a plurality of process technologies are currently practiced, wherein, for complex circuitry, such as microprocessors, storage chips, ASICs (application specific ICs) and the like, CMOS technology is one of the most promising approaches due to the superior characteristics in view of operating speed and/or power consumption and/or cost efficiency. During the fabrication of complex integrated circuits using CMOS technology, millions of complementary transistors, i.e., N-channel transistors and P-channel transistors, are formed above a substrate including a crystalline semiconductor layer. A MOS transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on, among other things, the distance between the source and drain regions, which is also referred to as channel length. Therefore, reducing the feature sizes, and in particular the gate length, of field effect transistors has been an important design criterion.

In view of further enhancing performance of transistors, in addition to other advantages, the SOI (semiconductor- or silicon-on-insulator) architecture has continuously been gaining in importance for manufacturing MOS transistors due to their characteristics of a reduced parasitic capacitance of the PN junctions, thereby allowing higher switching speeds compared to bulk transistors. In SOI transistors, the semiconductor region, in which the drain and source regions as well as the channel region are located, also referred to as the body, is dielectrically encapsulated. This configuration provides significant advantages, but also gives rise to a plurality of issues.

For example, semiconductor elements, such as diodes and the like, may have to be implemented in the substrate material due to certain device requirements, thereby necessitating the formation of appropriate areas in which the substrate material has to be exposed. For example, one important issue in high performance devices, such as microprocessors and the like, is an efficient device-internal temperature management due to the significant heat generation of the transistors. Due to the reduced heat dissipation capability of SOI devices caused by the buried insulating layer, the corresponding sensing of the momentary temperature in SOI devices is of particular importance. Typically, for thermal sensing applications, an appropriate diode structure may be used wherein the characteristic of the diode may permit information to be obtained on the thermal conditions in the vicinity of the diode structure. The sensitivity and the accuracy of the respective measurement data obtained on the basis of the diode structure may significantly depend on the diode characteristic, i.e., on the diode's current/voltage characteristic, which may in turn depend on temperature and other parameters. For thermal sensing applications, it may, therefore, typically be desirable to provide a substantially "ideal" diode characteristic in order to allow a precise estimation of the temperature conditions within the semiconductor device. In SOI devices, a corresponding diode structure, i.e., the respective PN junction, is frequently formed in a substrate window area, i.e., in the substrate material located below the buried insulating layer, above which is formed the "active" semiconductor layer used for forming therein the transistor elements, in combination with other diode structures used for monitoring purposes and the like. Thus, at least some additional process steps may be required, for instance, for etching through the semiconductor layer or a corresponding trench isolation area and through the buried insulating layer in order to expose the crystalline substrate material. On the other hand, the process flow for forming the substrate diode is typically designed so as to exhibit a high degree of compatibility with the process sequence for forming the actual circuit elements, such as the transistor structures.

Although providing substrate diodes in sophisticated SOI semiconductor devices is a promising approach for obtaining reliable temperature data during the operation of the semiconductor device, conventional approaches for forming substrate diodes may result in significant yield losses and, thus, loss of performance in the corresponding substrate window due to the continuous shrinkage of device features, such as transistors, lines and the like. For example, in sophisticated semiconductor devices comprising field effect transistors, the gate length has reached values of approximately 40 nm and less, thereby increasing packing density and also providing superior performance of the individual transistors. Similarly, the wiring network, i.e., the metallization system in combination with an appropriate contact level, has to be appropriately adapted to the increased packing density in the device level of sophisticated semiconductor devices, thereby also requiring contact elements and metal features of reduced lateral dimensions. At the same time, the thickness or height of the various metallization levels also may have to be reduced so as to correspond to the reduced lateral dimensions. During the fabrication of contact levels, i.e., the dielectric material and the corresponding contact elements formed therein that connect to the contact areas of the semiconductor-based circuit elements, and during the fabrication of the metallization layers of the complex metallization system, a plurality of very complex processes, such as lithography processes, deposition and patterning processes, have to be applied, which may have an influence on the characteristics of the substrate diode.

In particular, the metal silicide to be formed in the doped regions of the substrate diodes has a significant influence on the finally obtained diode characteristics, as will be described in more detail with reference to FIG. 1.

FIG. 1 schematically illustrates a cross-sectional view of a semiconductor device 100 in which a substrate diode 150B is formed in the crystalline substrate material 101B of a substrate 101. Furthermore, transistors 150A are formed in and above a semiconductor layer 103, which in turn is formed on a buried insulating material 102. Thus, the semiconductor device 100, or at least the portion shown in FIG. 1, may be considered as an SOI device. It should be appreciated that the semiconductor layer 103 in the manufacturing stage shown in FIG. 1 may represent a material layer having formed therein a plurality of "active" regions or semiconductor regions 103A, in and above which the transistors 150A are formed. The active regions, such as the region 103A, are typically separated laterally from each other by providing appropriate isolation regions 103C, which, for instance, are comprised of silicon dioxide. The transistors 150A may have any appropriate configuration in accordance with the overall device requirements and are typically provided in the form of field effect transistors having gate electrode structures 160, which in turn may comprise a gate dielectric material 162 and an electrode material 161, possibly in combination with a sidewall spacer structure 163. As discussed above, in sophisticated applications, a gate length of the gate electrode structures 160 may be 50 nm and less, thereby also restricting the space between adjacent gate electrodes to a lateral dimension that is the same order of magnitude. Furthermore, the transistors 150A comprise drain and source regions 151A, which are to be understood as highly doped areas in the active region 103A so as to form a PN junction, wherein the lateral and vertical profile depends on the manufacturing process applied to form the drain and source regions 151A. Moreover, a metal silicide 153 is typically provided in the drain and source regions 151A in order to reduce the overall contact resistivity. For example, nickel silicide, possibly in combination with platinum and the like, may be provided in sophisticated applications.

Similarly, the substrate diode 150B comprises a highly doped region 151B that forms a PN junction 151P with the surrounding crystalline substrate material 101B, which may have incorporated therein an appropriate dopant concentration. As will be explained later on in more detail, frequently, the highly doped region 151B may have substantially the same lateral and vertical concentration profile as at least deep drain and source areas of the drain and source regions 151A of the transistors 150A since the regions 151A, i.e., the deeper areas thereof, and the regions 151B are frequently formed on the basis of a common ion implantation process. Similarly, the regions 151B have incorporated therein the metal silicide 153.

Furthermore, in the manufacturing stage shown, a contact level 120 is provided in an intermediate manufacturing stage in which appropriate dielectric materials, such as an etch stop layer 121, for instance provided in the form of a silicon nitride material, in combination with the actual interlayer dielectric material 122, for instance in the form of silicon dioxide and the like, are formed above the transistors 150A and above the substrate diodes 150B and thus also within corresponding substrate openings or windows 101O, which extend through the semiconductor layer 103 and the buried insulating layer 102. As illustrated, contact openings 123A are provided so as to extend through the interlayer dielectric material 122 so as to be aligned to the drain and source regions 151A, depending on the contact regime required, while other contact openings 123G, which may typically be provided in a different width direction, i.e., a direction perpendicular to the drawing plane of FIG. 1, may extend to the gate electrode structures 160. Similarly, contact openings 123B are formed so as to extend into the substrate openings 101O. It should be appreciated that, in the manufacturing stage shown, the openings 123A, 123B, 123G are still separated from any underlying conductive areas by at least a portion of the etch stop layer 121.

The semiconductor device 100 as illustrated in FIG. 1 may be formed on the basis of the following process strategy. After forming the isolation region 103C, thereby also laterally delineating the active regions, such as the semiconductor region 103A, within the semiconductor layer 103, the basic doping is established, for instance, on the basis of ion implantation and the like. To this end, appropriate implantation and masking regimes may be applied. Thereafter, the gate electrode structures 160, that is the electrode material 161, are formed by providing appropriate materials and patterning the same on the basis of complex lithography and etch techniques in order to obtain the desired lateral dimensions in compliance with the overall design rules. Furthermore, additional dopant species may be incorporated into the active region 103A, for instance for forming drain and source extension regions (not shown), counter-doped regions, i.e., regions of increased well dopant concentration and the like, as is required for establishing the complex dopant profile, in particular in the vicinity of channel regions 152, which are positioned between drain and source regions. At any appropriate manufacturing stage, the substrate openings 101O, which extend from the sidewall 101S to the opposite sidewall, are formed by applying appropriate etch techniques wherein, prior to or after forming the openings 101O, or in an intermediate patterning stage, an appropriate base doping, if required, may be implemented into the crystalline substrate material 101B. It should be appreciated that typically the lateral dimensions of the openings 101O are significantly greater compared to the spacing between closely spaced gate electrode structures 160 in order to provide appropriately dimensioned PN junctions of the diodes 150B and also enable superior connection to contact elements still to be formed within the contact openings 123B. At any appropriate manufacturing stage, in some conventional approaches, the drain and source dopant species for the transistors 150A, for the deep drain and source areas, are incorporated on the basis of an ion implantation process, while concurrently the highly doped regions 151B are formed, thereby avoiding any additional masking and implantation steps for forming the regions 151B. After any anneal processes for activating the dopant species and re-crystallizing implantation-induced damage, the device 100 is prepared for forming the metal silicide regions 153.

It should be appreciated, however, that, after incorporating the dopant species for the drain and source regions 151A and the doped regions 151B, a plurality of cleaning processes have to be applied, for instance for removing resist material, removing contaminants and the like, as is typically required in the complex fabrication processes for forming sophisticated semiconductor devices. In particular during any such processes, a certain degree of material erosion may occur within the opening 101O, which may be substantially comprised of silicon dioxide, at least within the buried insulating material 102, thereby increasingly "widening" the opening 101O, as indicated by 101R. Consequently, the sidewalls 101S may have been "displaced" after incorporating the dopant species for the regions 151B and prior to actually forming the metal silicide 153. Consequently, when applying the silicidation process, the lateral offset between the PN junction 151P and the metal silicide 153 is reduced due to the material erosion that results in the "recessed" sidewalls 101S. This reduced lateral offset may result in significant alterations of the finally obtained diode characteristics, in particular during the further processing when forming the contact openings 123A, 123G, 123B and adjusting the final cross-sectional shape. Furthermore, the reduced offset of the metal silicide 153 from the PN junction 151P may additionally result in an increased probability of creating short circuits and thus leakage paths, which may also contribute to a reduced performance of the resulting substrate diodes 150B.

After forming the metal silicide 153, which is accomplished on the basis of well-established silicidation techniques, the material or material system of the contact level 120 is formed, for instance, by depositing the etch stop layer 121, for instance using plasma enhanced chemical vapor deposition (CVD), followed by the deposition of the material 122, for instance by CVD, spin-on techniques and the like. If required, a planarization may be applied so as to prepare the device for the subsequent complex patterning process for forming the contact openings 123A, 123G and 123B. During the patterning process, it is etched through the material 122 while using the layer 121 as an efficient etch stop material.

As discussed above, due to the overall reduced dimensions of sophisticated semiconductor devices, the contact openings 123A, 123G also have to be provided with adapted dimensions, which may thus result in high aspect ratio openings, in particular for the openings 123A. In view of providing superior conditions for the subsequent filling in of a contact material, such as tungsten, in combination with appropriate barrier materials, a certain rounding of the upper portions of the contact openings 123A, 123G may be necessary in order to obtain tapered or rounded upper portions 123U. To this end, preferably the etch mask, typically a resist material, possibly in combination with any anti-reflective coating (ARC) material, may be removed after etching through the layer 122 and applying an additional dedicated material removal process, for instance in the form of anisotropic etch processes, ion sputtering processes and the like. As explained before, typically, the contact openings 123B may have significantly greater lateral dimensions, so that an enhanced removal rate may be observed at the bottom of the opening 1010, thereby even "etching" through the layer 121. Consequently, the metal silicide 153 may thus be exposed or at least the corresponding etch stop liner may be significantly reduced, thereby also resulting in undue exposure of the material 153 during the further processing, i.e., during opening the etch stop layer 121. As a consequence of the premature exposure of the material 153, the diode characteristics may be significantly influenced, for instance due to the reduced lateral offset of the material 153 from the PN junction 151P, as discussed above.

In some conventional approaches, superior integrity of the diode characteristics may be achieved by altering the process flow for forming the drain and source regions 151A and the doped regions 151B. That is, a dedicated implantation process may be applied for forming the doped regions 151B with appropriately adapted implantation parameters in order to obtain an increased lateral distribution of the incorporated dopant species. In this manner, the probability of negatively influencing the diode characteristic is significantly reduced, even for a process flow in which the rounded upper areas 123U are to be provided. On the other hand, additional lithography steps in combination with resist removal processes are required in order to separately implement the drain and source regions 151A on the one hand and the doped regions 151B on the other hand. Hence, the overall complexity of the manufacturing process is significantly increased.

In view of the situation described above, the present disclosure relates to manufacturing techniques and semiconductor devices in which substrate diodes may be provided with superior integrity of the diode characteristics, while avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques and semiconductor devices in which superior integrity of PN junctions of substrate diodes may be achieved by increasing the lateral offset between a metal silicide and a PN junction without contributing to overall process complexity and/or by ensuring integrity of the metal silicide upon forming contact openings. To this end, appropriate sacrificial fill materials may be applied at any appropriate manufacturing stage, for instance for forming a spacer element in the substrate opening after incorporating the dopant species and prior to forming the metal silicide, while, in other illustrative embodiments disclosed herein, in addition to or alternatively to the former device strategy, in particular the critical step of corner rounding in the contact openings, if required, may be performed in the presence of a sacrificial fill material, which may thus reliably protect the bottom of the contact openings and thus the metal silicide in the substrate diodes.

One illustrative method disclosed herein comprises forming an opening through a region of a semiconductor layer and through a buried insulating layer of an SOI device so as to expose a portion of a crystalline substrate material of the SOI device. The method further comprises performing an implantation process so as to form a doped region in the exposed portion of the crystalline substrate material and to form drain and source regions of a transistor that is formed in and above a semiconductor region of the semiconductor layer. Additionally, the method comprises forming a liner in the opening and above the transistor and forming a sacrificial fill material selectively in the opening. Furthermore, the method comprises removing the liner outside of the opening by using the sacrificial fill material as an etch mask. Moreover, a metal silicide is formed in the doped region and in the drain and source regions.

A further illustrative method disclosed herein comprises forming an interlayer dielectric material in and above a substrate opening and a transistor, wherein the substrate opening is formed in a semiconductor layer and a buried insulating layer of an SOI device and connects to a crystalline substrate material. The transistor is formed in and above a semiconductor region in the semiconductor layer. The method further comprises forming a first contact opening and a second contact opening in the interlayer dielectric material, wherein the first contact opening extends into the substrate opening without exposing a metal silicide region formed in the crystalline substrate material. The second contact opening is aligned to the drain region or source region. Moreover, a sacrificial fill material is formed in the first and second contact openings and a material removal process is performed so as to round an upper portion of the first and second contact openings in the presence of the sacrificial fill material.

One illustrative semiconductor device disclosed herein comprises a substrate opening extending through a semiconductor layer and a buried insulating layer. The device further comprises a doped region of a substrate diode that forms a PN junction with a crystalline substrate material. Moreover, a spacer is formed on sidewalls of the substrate opening, wherein the spacer is formed on a portion of the doped region. Moreover, the semiconductor device comprises a metal silicide formed in the doped region and having a lateral offset from the PN junction that substantially corresponds to a width of the spacer. Additionally, the device comprises a transistor that is formed in and above a semiconductor region, which in turn is formed in the semiconductor layer, wherein the transistor comprises drain and source regions.

BRIEF DESCRIPTION OF THE DRAWINGS

The disclosure may be understood by reference to the following description taken in conjunction with the accompanying drawings, in which like reference numerals identify like elements, and in which:

FIGS. 2h-2l schematically illustrate cross-sectional views of the semiconductor device according to further illustrative embodiments in which, additionally or alternatively to applying the process strategy described above with reference to FIGS. 2a-2g, superior diode characteristics may be obtained by performing a corner rounding process for contact openings on the basis of a sacrificial fill material.

Figure 1:
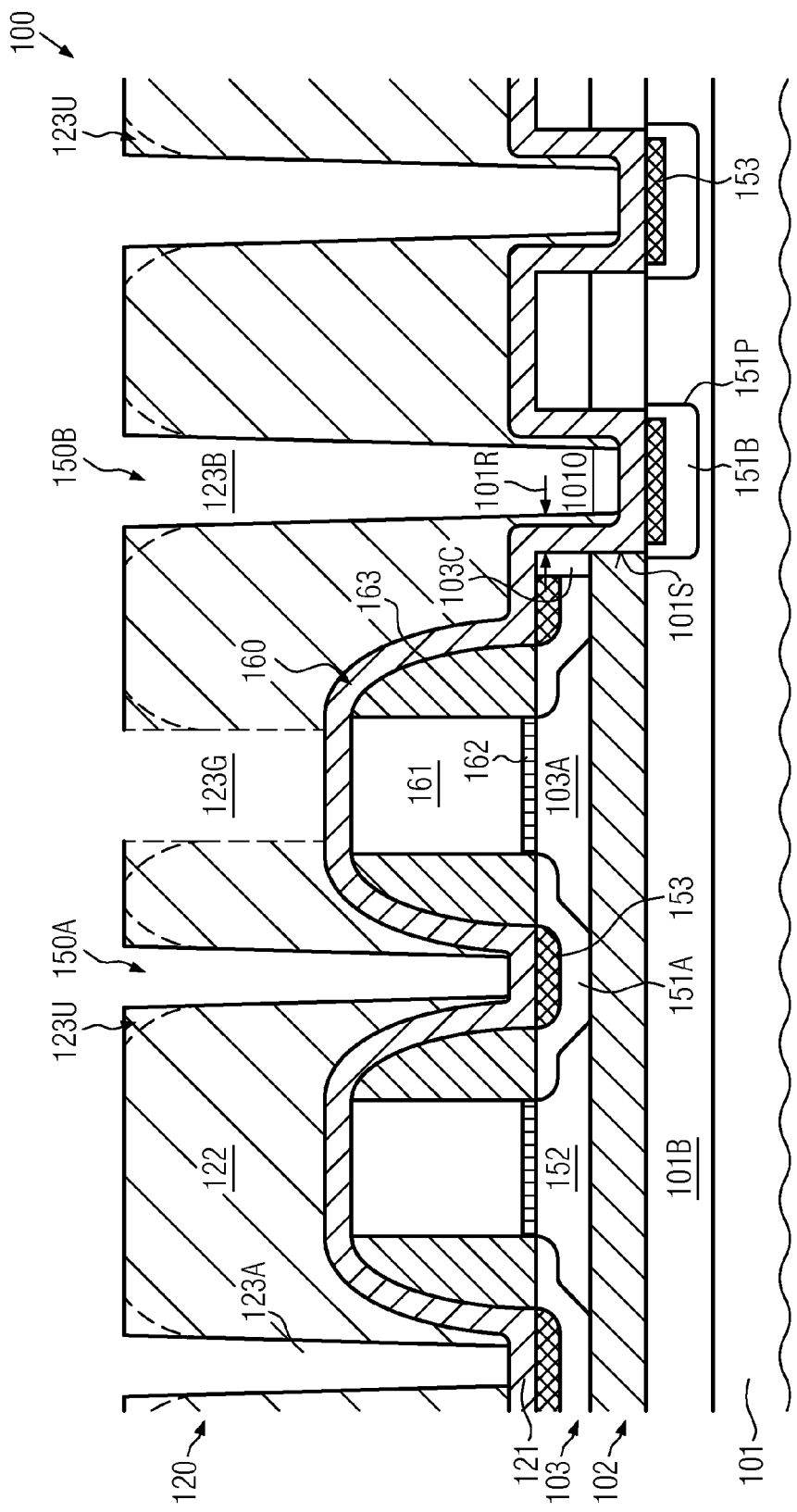
FIG. 1 schematically illustrates a cross-sectional view of a complex semiconductor device in a manufacturing stage for forming tapered contact openings, wherein characteristics of a substrate diode may be significantly affected at least by forming the contact openings, according to conventional strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

According to the principles disclosed herein, substrate diodes in SOI devices may be provided with superior diode characteristics, which may be achieved by ensuring superior integrity of the metal silicide regions to be formed in the doped semiconductor region of the substrate diode. The superior diode characteristics may be achieved without requiring any additional lithography steps, thereby avoiding undue process complexity or still reducing overall process complexity compared to conventional process strategies. To this end, in some illustrative embodiments, the lateral offset of a metal silicide region from the PN junction in the substrate diode may be adjusted by incorporating a sidewall spacer on sidewalls of the substrate opening or window after incorporating the dopant species and prior to performing the silicidation process. The spacer may be incorporated on the basis of an appropriate process regime using a sacrificial fill material without requiring an additional lithography process. Consequently, even critical process steps, such as the formation of sophisticated contact openings, may be accomplished with superior process results, even if a critical corner rounding process is to be applied for the contact openings. In other illustrative embodiments, the process of forming contact openings with a rounded or tapered upper portion may be performed on the basis of an appropriate sacrificial fill material, which may be applied without requiring a lithography step based on a corresponding lithography mask, thereby preserving integrity of a bottom etch stop layer and thus of the metal silicide upon performing the corner rounding process.

In some illustrative embodiments, the metal silicide may be provided with the superior greater lateral offset from the PN junction in the substrate diode, as described above, while additionally sophisticated contact openings may be formed on the basis of a corner rounding process based on a sacrificial fill material. In this manner, overall diode characteristics may further be improved.

With reference to FIGS. 2a-2l, further illustrative embodiments will now be described in more detail, wherein reference may also be made to FIG. 1, if appropriate.

Figure 2A:
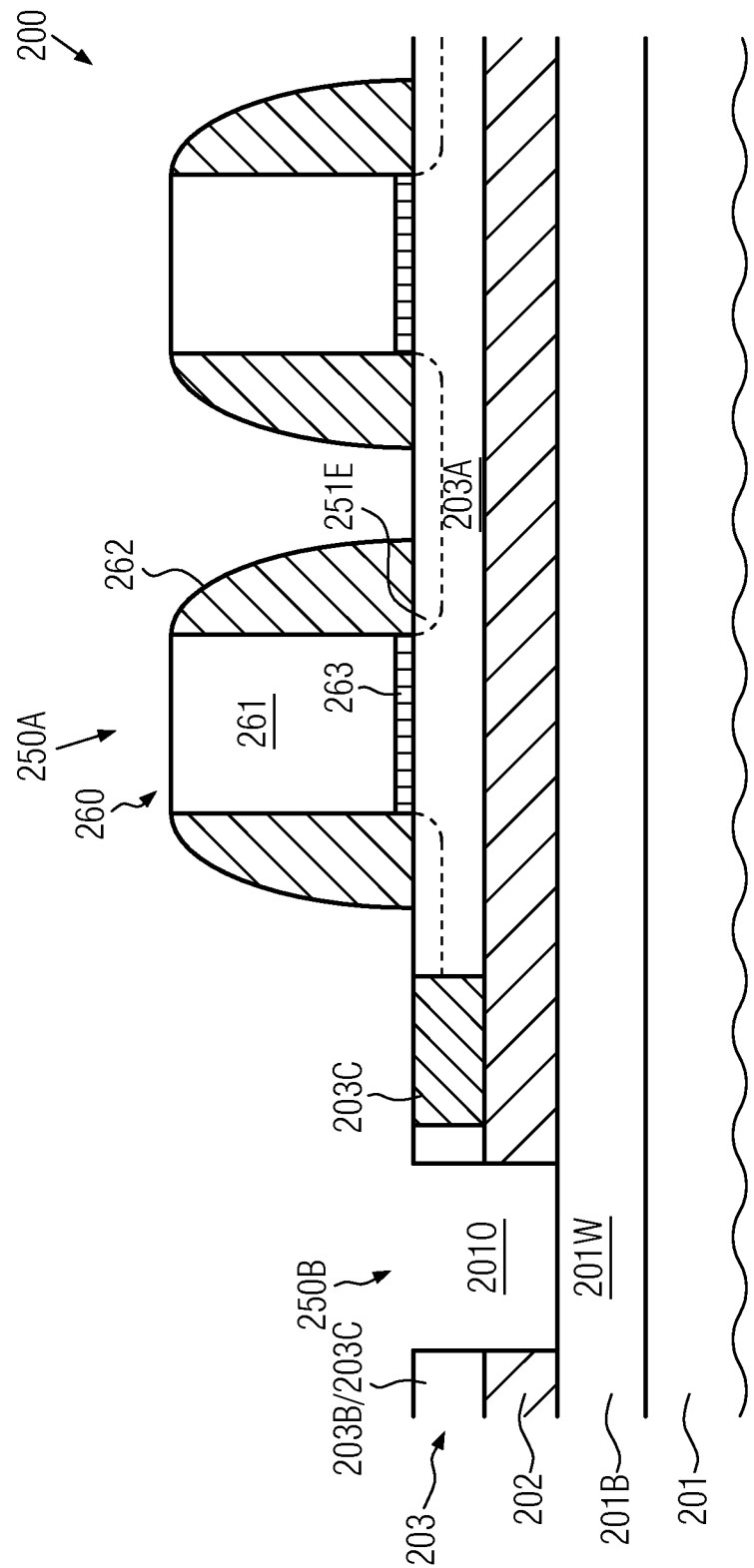
FIGS. 2a-2g schematically illustrate cross-sectional views of a semiconductor device during various manufacturing stages in forming drain and source regions, i.e., deep areas thereof, and a doped region of a substrate diode in a common implantation process, while an increased lateral offset may be obtained for a metal silicide based on a spacer element formed without requiring additional lithography steps, according to illustrative embodiments.

FIG. 2a schematically illustrates a cross-sectional view of a semiconductor device 200, which may represent an SOI device, at least within certain device areas, and which may thus comprise a substrate 201 having provided therein a crystalline substrate material 201B, followed by a buried insulating layer 202 and a semiconductor layer 203. With respect to these components, the same criteria may apply as previously explained with reference to the semiconductor device 100. In the manufacturing stage shown, a substrate opening or substrate window 201O may be formed so as to extend through the semiconductor layer 203 and the buried insulating layer 202 in order to expose a portion 201W of the crystalline substrate material 201B, in which a doped region of a substrate diode 250B is to be provided. As shown, the opening 201O may extend through the semiconductor layer 203 in a specific semiconductor region 203B or in an isolation region 203C, which may also laterally separate or delineate an active region 203A formed in the semiconductor layer 203. For example, one or more transistors 250A may be formed in and above the semiconductor region 203A and may have any appropriate configuration. For example, in this stage, the transistor 250A may comprise a gate electrode structure 260 including a gate dielectric layer 263, a spacer structure 262 and an electrode material 261. It should be appreciated that the gate electrode structures 260 may have any appropriate configuration in terms of lateral dimensions, material composition of the materials provided therein and the like. For example, the gate dielectric material 263 may comprise a high-k dielectric material and the electrode material 261 may comprise a metal-containing electrode material, possibly in combination with a semiconductor-based electrode material and the like. Similarly, the spacer structure 262 may have any appropriate configuration, for instance two or more individual spacer elements in combination with etch stop liners (not shown) may be provided therein. As discussed above, the gate electrode structures 260 may have lateral dimensions, i.e., a gate length, i.e., in FIG. 2a the horizontal extension of the electrode material 261, of 50 nm and less, thereby also requiring reduced pitch between adjacent gate electrode structures 260, in particular in densely packed device areas, as is also discussed above. In the manufacturing stage shown, drain and source extension regions 251E may be formed in the active region 203A, if required.

The semiconductor device 200 as shown in FIG. 2a may be formed on the basis of any appropriate process strategy, as is, for instance, also described above with reference to the device 100, i.e., after forming the gate electrode structures 260, at any appropriate stage the substrate opening 201O may be formed on the basis of well-established lithography and etch techniques.

Figure 2B:
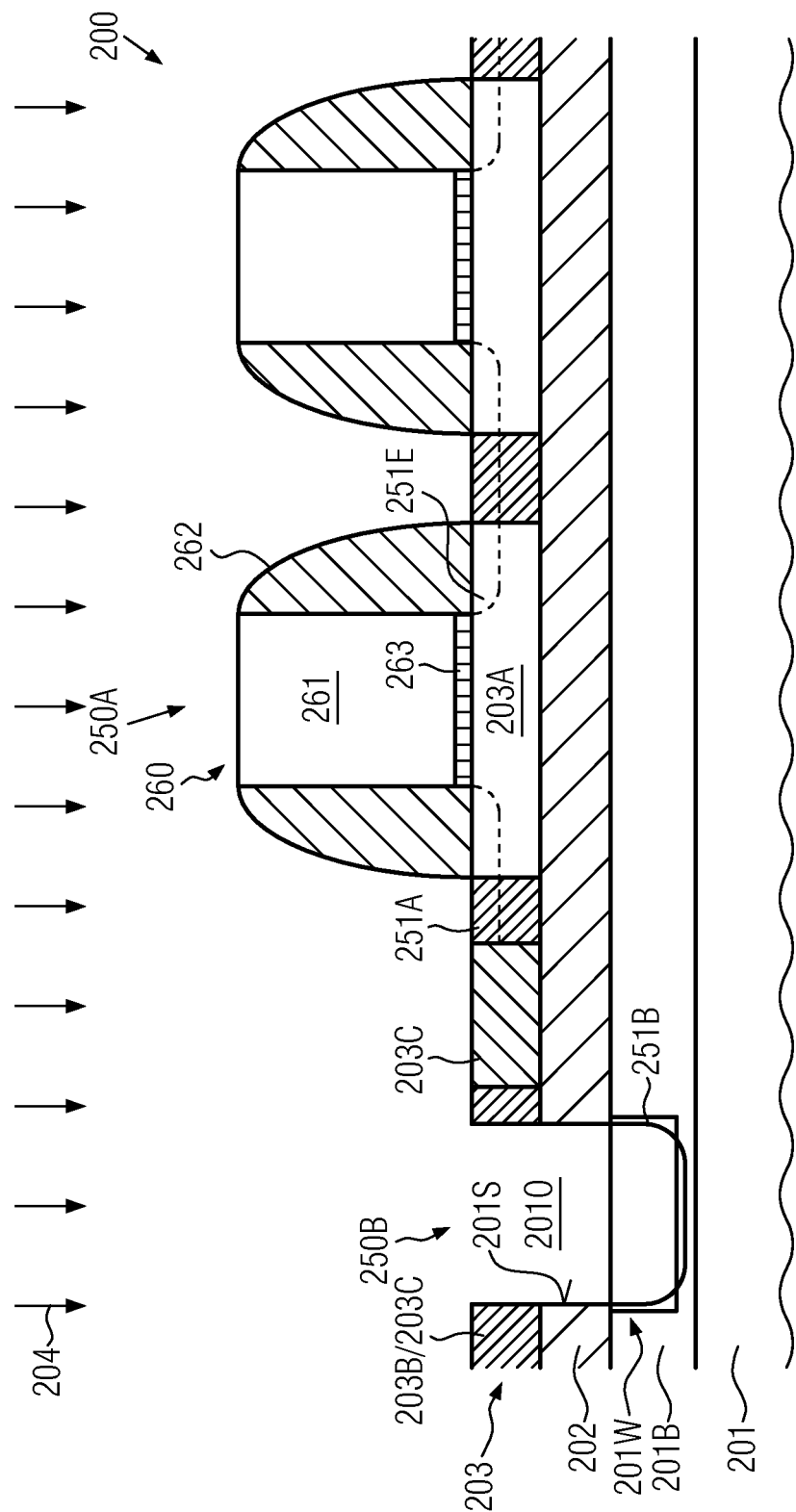

FIG. 2b schematically illustrates the device 200 during an ion implantation process 204 in which an appropriate dopant species may be incorporated into the exposed portion 201W of the substrate diode 250B through the opening 201O, while at the same time drain and source regions 251A may be formed, i.e., corresponding deep areas thereof, if previously the extension regions 251E have been formed. Consequently, the drain and source regions 251A, except for the extension regions 251E, if provided, may have basically the same vertical dopant concentration profile, at least in a thickness that corresponds to the thickness of the semiconductor layer 203 and thus of the active region 203A since, depending on the parameters of the process 204, a certain amount of dopant species may also penetrate the buried insulating layer 202 below the drain and source regions 251A, at least at a surface and down to a depth that corresponds to a depth of the active region 203A. The doped region 251B may have a very similar concentration profile. After the implantation process 204, further processes may be applied, for instance requiring the application of wet chemical etch chemistries, as also discussed above, which may result in certain material erosion on sidewalls 201S of the opening 201O, as discussed above. Moreover, any anneal processes may be performed in order to adjust the final lateral and vertical dopant profile of the regions 251A, 251B.

Figure 2C:
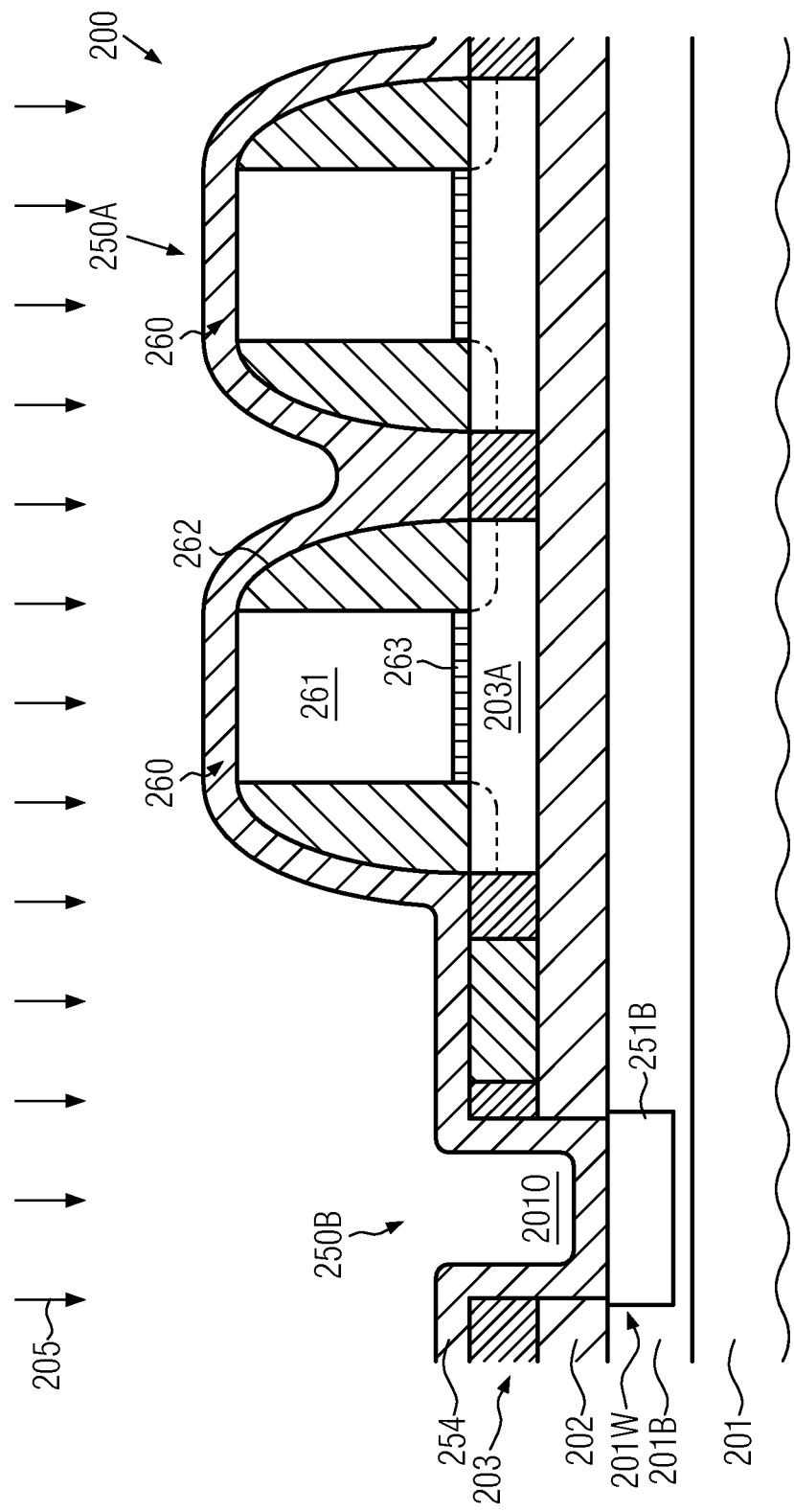

FIG. 2c schematically illustrates the device 200 in a further advanced manufacturing process. As shown, a liner or spacer layer 254 is formed within the opening 201O and above and between the gate electrode structures 260. For example, the layer 254 may be provided in the form of a silicon dioxide material, a silicon nitride material and the like, depending on the material composition of the gate electrode structures 260. The material 254 may be provided in a substantially conformal manner, except for the narrow spacing between the densely packed gate electrode structures 260, and may have a thickness of approximately 5-30 nm, wherein other values may also be used, depending on the overall device geometry.

In the example shown in FIG. 2c, the thickness of the material 254 may result in a substantially complete filling of the space between the gate electrode structures 260 which, however, may not negatively affect the further processing. The material 254 may be provided on the basis of any well-established deposition techniques, such as plasma enhanced CVD and the like. Next, the device 200 may be exposed to a reactive etch atmosphere 205 of a plasma assisted etch process in order to remove a significant portion of the layer 254. To this end, any well-established etch recipes may be applied, for instance using selective etch chemistries for removing silicon dioxide selectively with respect to silicon, silicon nitride and the like. Consequently, the material of the liner 254 is preferably removed from horizontal device areas, while forming spacer structures on substantially vertical device areas, such as within the substrate opening 201O, as is shown in FIG. 2d.

Figure 2D:
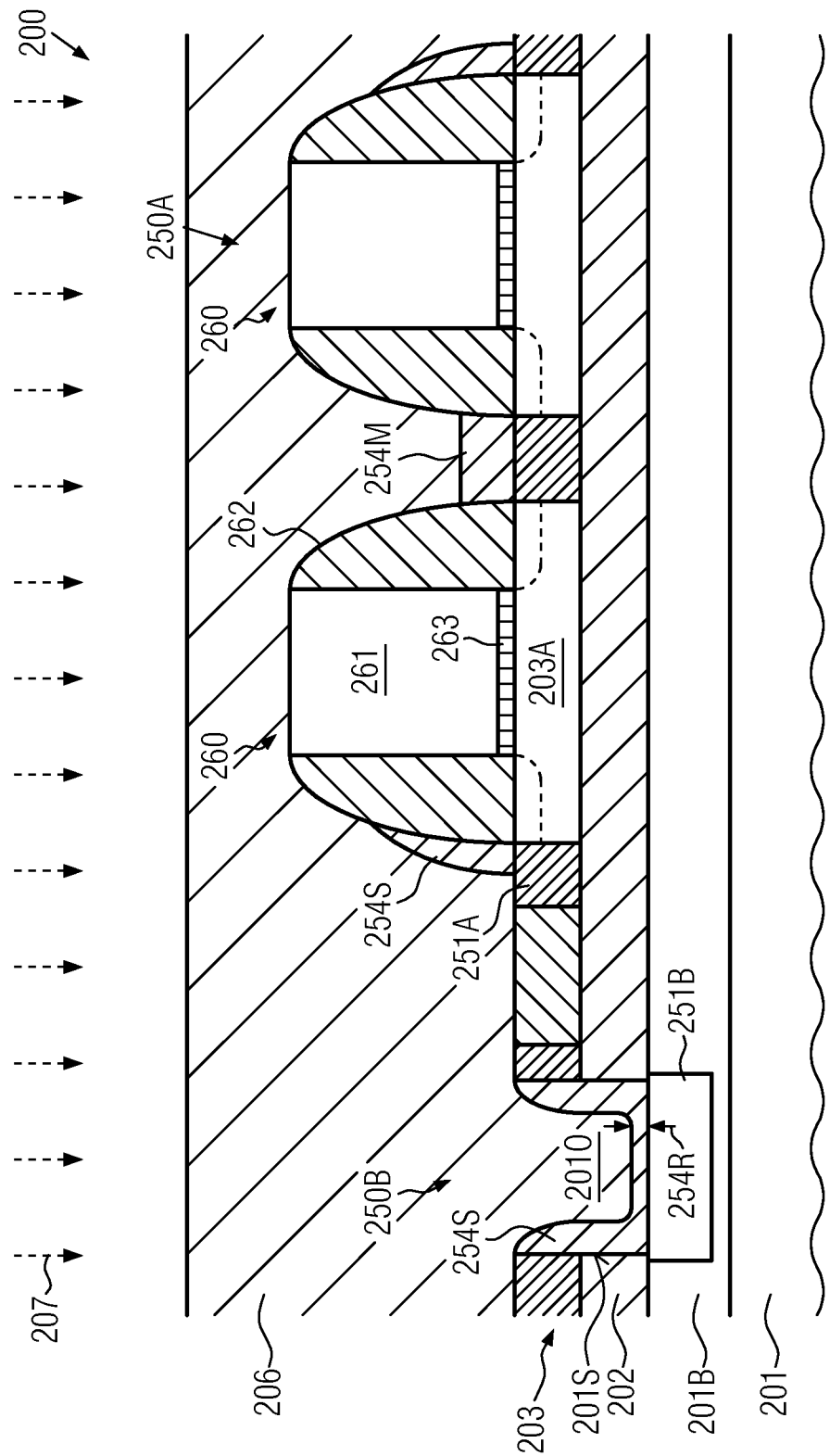

FIG. 2d schematically illustrates the device 200 in a further advanced manufacturing stage. As illustrated, spacers 254S may be formed as residues from the layer 254 (FIG. 2c) on non-horizontal device areas, such as the sidewalls 201S of the opening 201O and on a portion of the spacer structure 262. Furthermore, a portion 254M may also be present in the narrow spacing between the gate electrode structures 260. In some illustrative embodiments, the previously performed etch process 204 (FIG. 2c) may not result in a substantially complete removal of the liner material at the bottom of the opening 201O so that a layer of reduced thickness 254R may still be present in the opening 201O. Consequently, a corresponding "over-etch step" upon forming the spacers 254S may be avoided or may be performed with reduced process time, thereby not unduly exposing active semiconductor areas, such as the drain and source regions 251A, to the reactive etch atmosphere.

Moreover, a layer of a sacrificial material 206 may be formed in and above the opening 201O and above the transistors 250A. In some illustrative embodiments, the material 206 may represent a material that may be deposited in a low viscous state so as to provide a substantially planar surface topography after the application of the material 206. In other cases, the material may have any other material composition as long as its material characteristics are compatible with the further processing, i.e., with a non-masked removal of an excess portion thereof while maintaining at least a significant portion of the material 206 within the substrate opening 201O. In some illustrative embodiments, the material 206 may be exposed to radiation 207 in order to initiate a photo chemical reaction, at least in upper portions of the material 206, thereby enabling a subsequent removal with superior efficiency while still maintaining the material 206 within the opening 201O, or at least within a significant portion thereof. For example, the material 206 may be provided as a resist material, i.e., as a photosensitive material, which may be exposed without requiring a lithography mask. It should be understood that, within the context of the present application, the term "lithography process or step" is to be understood as a lithography process requiring a dedicated lithography mask in order to obtain a certain lateral patterning within the photosensitive material. On the other hand, the "non-masked" or blanket exposure to the radiation 207 is a very non-critical and high throughput process, contrary to an actual lithography process.

Figure 2E:
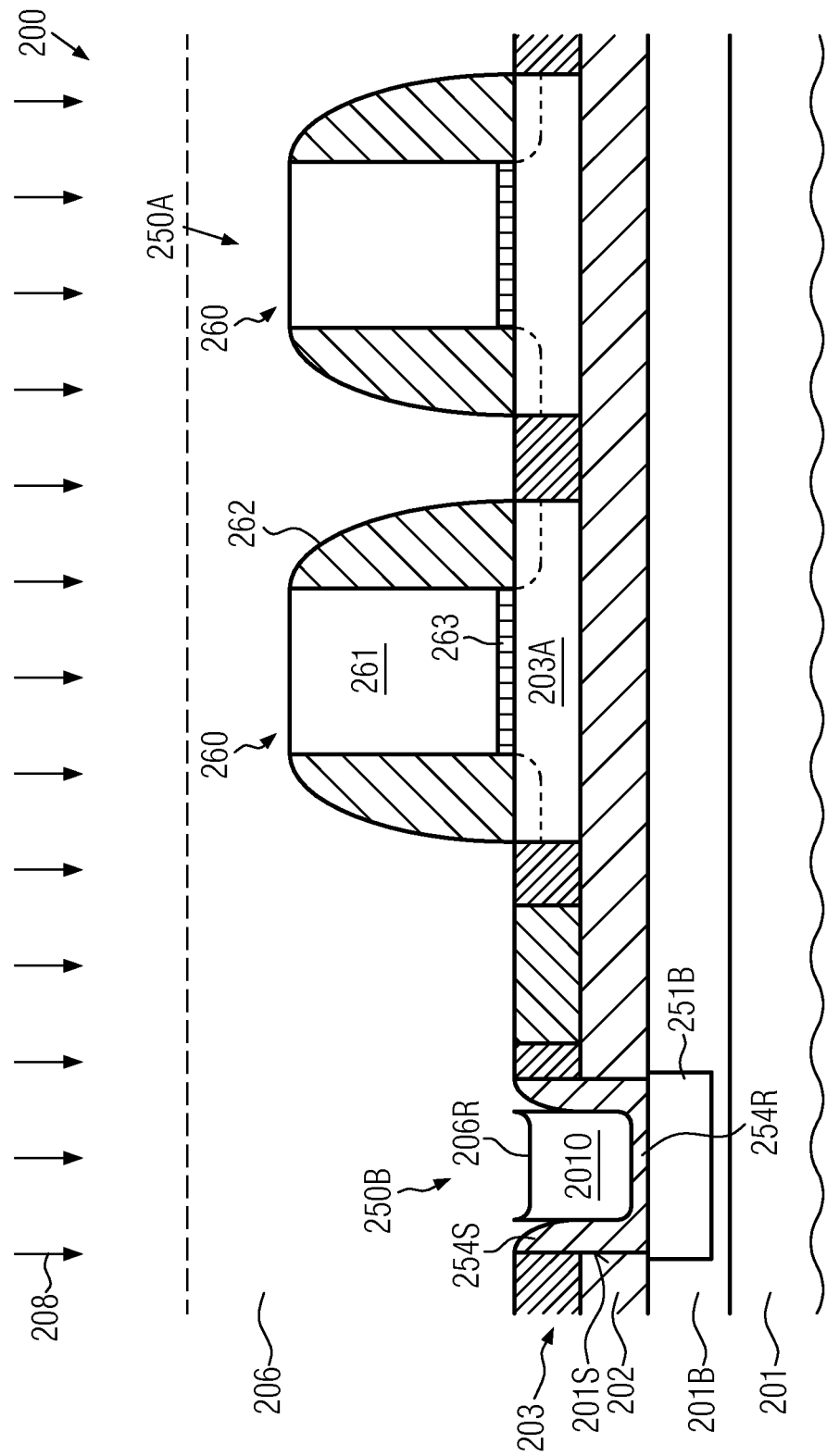

FIG. 2e schematically illustrates the device 200 when exposed to an etch atmosphere that is appropriately configured to remove an excess portion of the material 206 while preserving a portion 206R within the opening 201O. To this end, well-established process removal chemistries may be applied. Moreover, as described above, the "blanket" exposure of the material 206 may also result in superior removal rates while the remaining portion 206R may have received a significantly reduced exposure dose, thereby preserving a moderately high etch resistivity. In some illustrative embodiments, the process 208 may represent a sequence for removing excess portions of the material 206 and subsequently removing any exposed material residues of the previously formed liner material 254, i.e., the residue 254S formed on the gate electrode structures 260 and the residue 254M (FIG. 2d). To this end, well-established wet chemical etch recipes may be applied, for instance based on hydrofluoric acid (HF) and the like, depending on the material composition of the material 254. On the other hand, the spacer 254S may be substantially preserved within the opening 201O due to the presence of the material 206R.

Thereafter, the processing may be continued by removing the material 206R, which may be established on the basis of appropriate wet chemical etch recipes, and thereafter the device 200 may be prepared for the formation of a metal silicide, which may include corresponding cleaning processes, as is also discussed above. Consequently, upon removing the sacrificial fill material 206R from the opening 201O, the liner material 254R with the reduced thickness may be exposed and may finally be removed during the corresponding cleaning processes, wherein also a certain amount of material erosion in the spacer 254S may occur, however, a desired width of the spacer 254S may still be preserved.

Figure 2F:
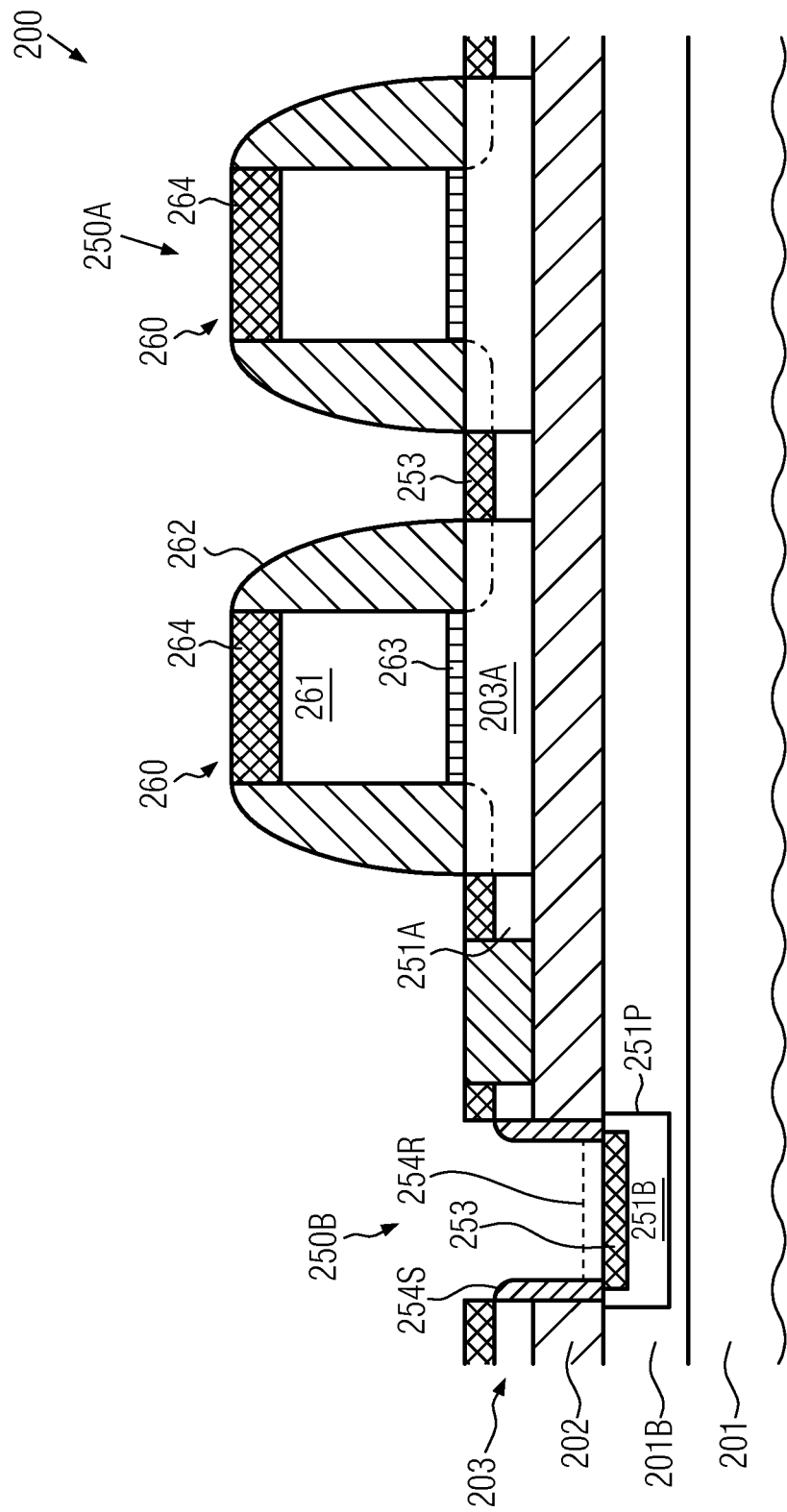

FIG. 2f schematically illustrates the device 200 in a further advanced manufacturing stage. As shown, metal silicide 253 may be formed in the drain and source regions 251A and in the doped region 251B after the removal of the thin liner 254R, wherein, thus, a lateral offset of the material 253 from the PN junction 251P of the substrate diode 250B is essentially determined by the spacer 254S. As discussed above, a desired final width of the spacer 254S and thus a desired increase of lateral distance between the material 253 and the PN junction 251P may be readily adjusted by selecting an appropriate initial thickness of the liner material 254 (FIG. 2c). Consequently, any well-established silicidation process techniques may be applied, for instance also forming a metal silicide 264 in the gate electrode structures 260, while still preserving the desired characteristics in the substrate diode 250B.

Figure 2G:
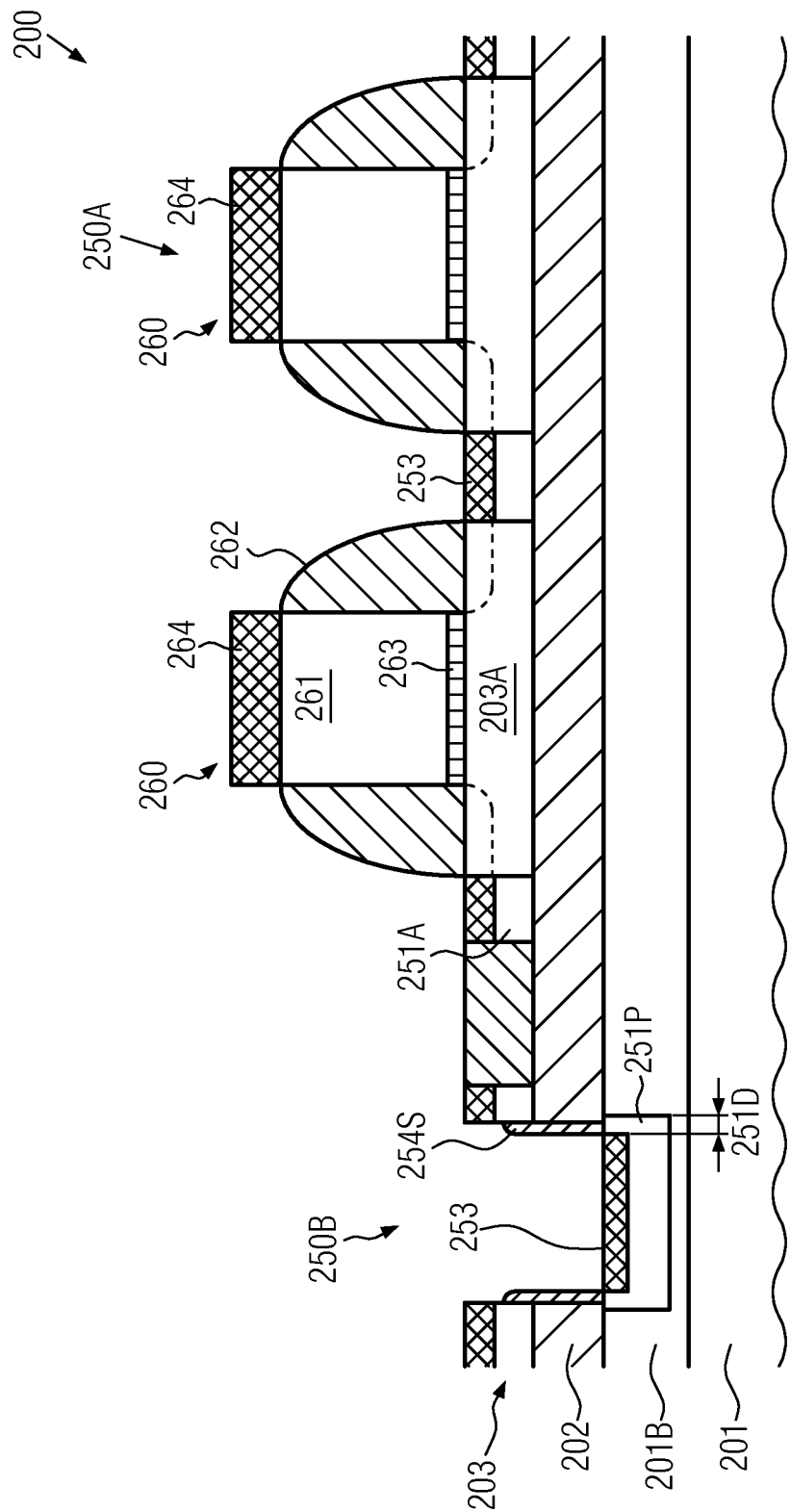

FIG. 2g schematically illustrates the device 200 in a further advanced manufacturing stage according to illustrative embodiments in which a width of the spacer structure 262 may be reduced, for instance, by applying wet chemical etch recipes, plasma assisted etch recipes and the like, in order to provide a superior surface topography for the subsequent deposition of one or more dielectric layers of a contact level still to be formed.

Consequently, the further processing may be continued by depositing an interlayer dielectric material and forming contact elements therein, wherein the process of forming the contact elements may be less critical with respect to a degradation of the metal silicide 253 in the substrate diode 250B due to the increased lateral offset 251D adjusted on the basis of the spacer 254S.

With reference to FIGS. 2h-2l, further illustrative embodiments will now be described in more detail in which, additionally or alternatively to the process sequence described above, a further improvement of metal silicide integrity and thus diode characteristics may be achieved upon performing a contact patterning process that requires the provision of rounded or tapered upper portions of the contact openings.

Figure 2H:
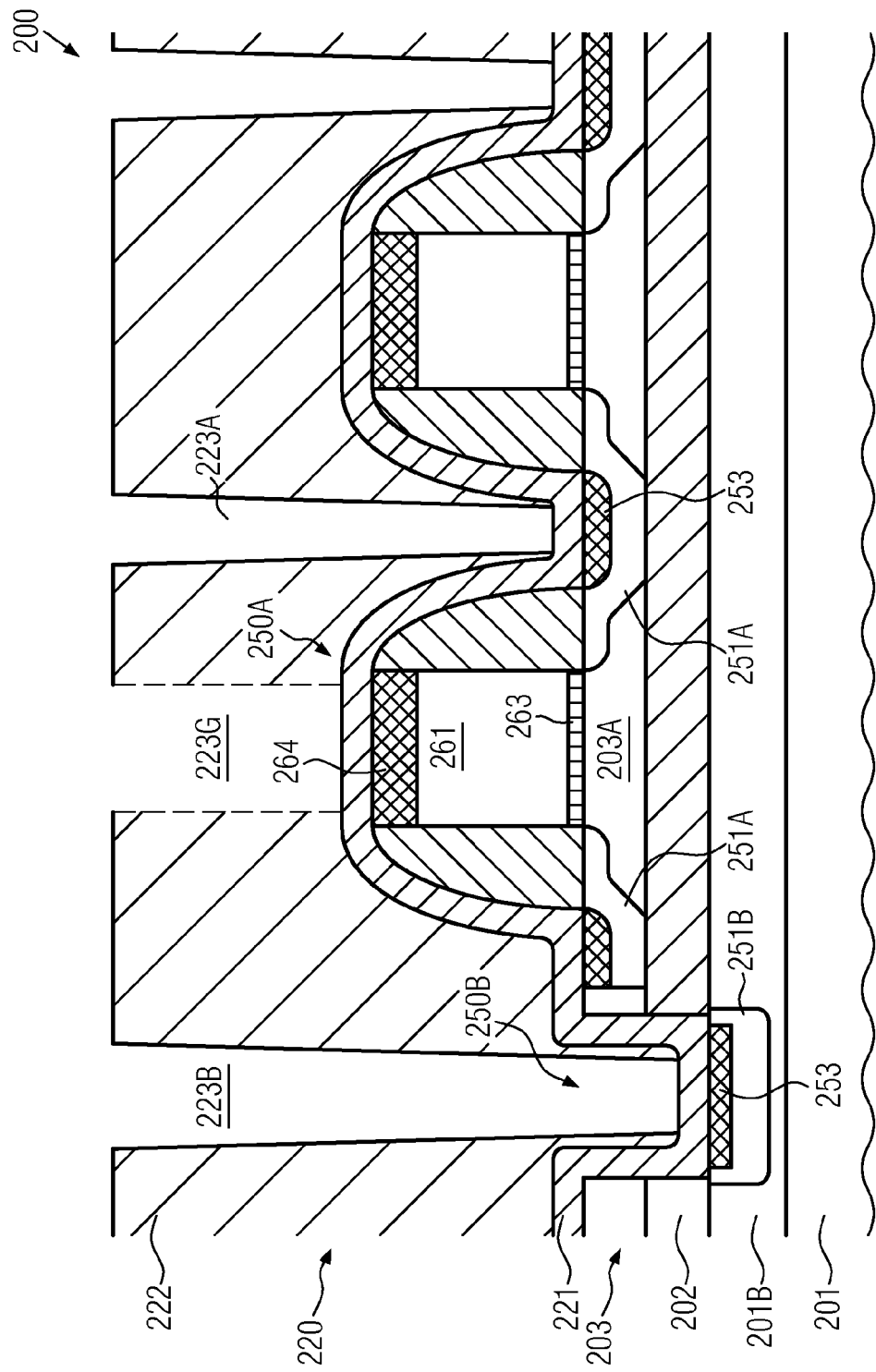

FIG. 2h schematically illustrates the device 200 in an advanced manufacturing stage, for instance after having applied the process sequence as described above with reference to FIGS. 2a-2g, while in other cases any other appropriate process strategy may be applied. As shown, a contact level 220 may comprise an etch stop layer 221, for instance a silicon nitride material, possibly in a highly stressed state, followed by an interlayer dielectric material 222, such as a silicon dioxide material and the like. Furthermore, a contact opening 223B is formed so as to extend through the material 222 and to or slightly into the etch stop material 221. Similarly, a contact opening 223A may be provided so as to extend through the material 222 and to or slightly into the etch stop material 221 above the drain region or source region 251A of the transistors 250A. Similarly, a contact opening 223G may be formed in the material 222 and may be aligned to the gate electrode structures 260, as is also discussed above with reference to the semiconductor device 100.

The semiconductor device 200 may be formed on the basis of process techniques as described above, or on the basis of any appropriate process strategy for forming the transistors 250A and the substrate diode 250B including the metal silicide 253 in the doped region 251B and the drain and source regions 251A, respectively. Thereafter, the material 221 may be deposited, for instance by plasma enhanced CVD, possibly in a highly stressed state, if the corresponding stress level may be advantageous for enhancing performance of the transistors 250A. To this end, any well-established deposition recipes may be applied. Thereafter, the material 222 may be deposited and possibly planarized, followed by a patterning process performed on the basis of any appropriate lithography and etch technique. In this manner, the openings 223A, 223B and 223G may be formed so as to extend to and into the etch stop layer 221.

Figure 2I:
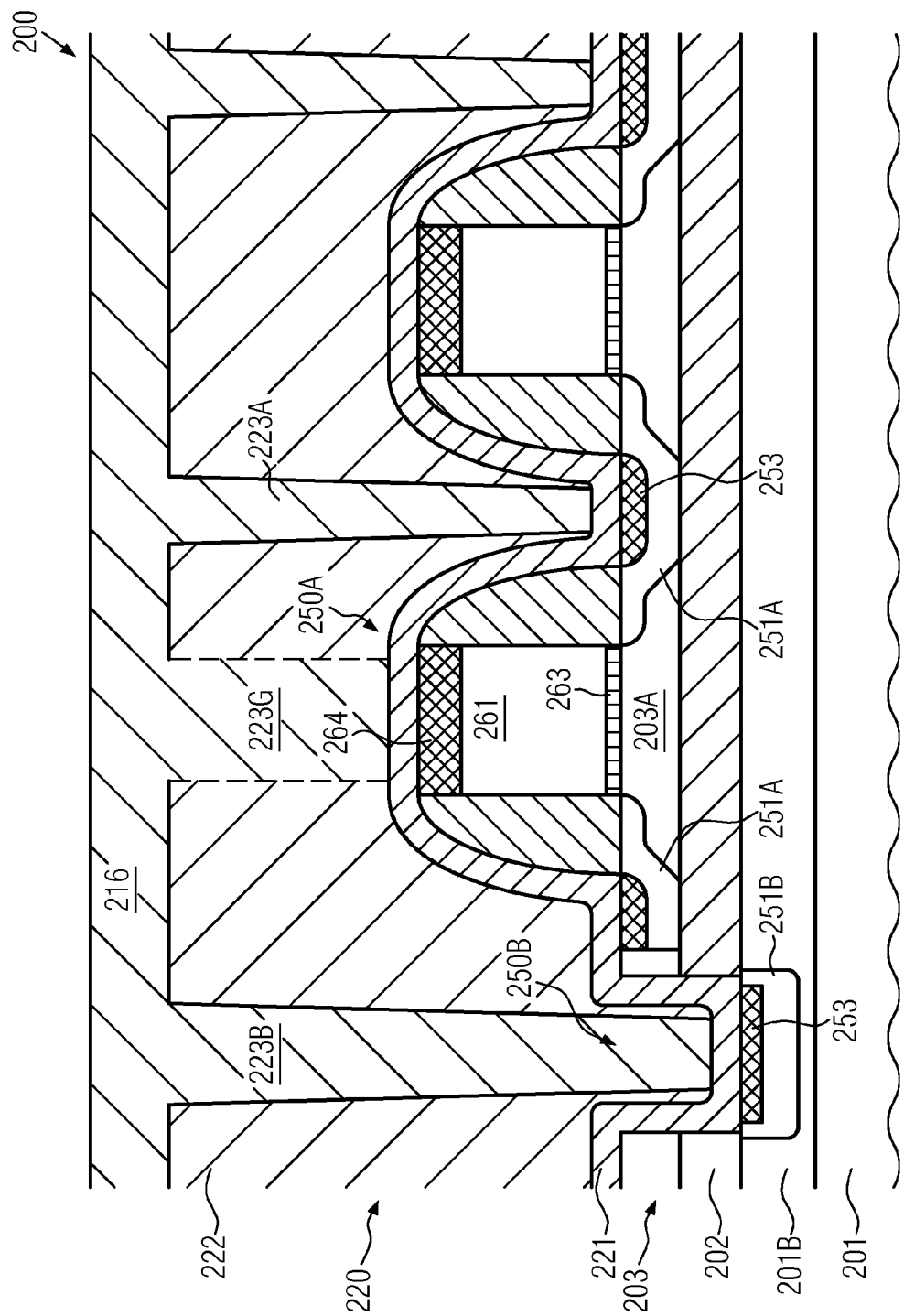

FIG. 2i schematically illustrates the device 200 in a further advanced manufacturing stage. As shown, a layer of a sacrificial fill material 216 may be formed in the contact openings 223A, 223G and 223B, which may be accomplished by, for instance, depositing the material 216 in a low viscous state on the basis of spin-on techniques and the like, possibly followed by an appropriate material treatment, such as a heat treatment, a radiation treatment and the like. Thereafter, an excess portion of the material 216 may be removed, for instance by any appropriate wet chemical or plasma assisted etch process, in order to expose the upper portions of the contact openings 223A, 223B, which may then be subjected to further treatment in order to obtain a desired tapered or rounded configuration. In some illustrative embodiments, the material 216 may be removed on the basis of a development process, as is typically used for photosensitive material, wherein, if required, an additional blanket exposure may be applied in which, in particular, the material within the openings 223A, 223B and 223G may experience a different exposure dose compared to the excess portion of the material 216 formed above the layer 222. In other illustrative embodiments, any appropriate fill material may be used which may be removed in a later manufacturing stage without significantly affecting any lower lying materials. In other cases, the excess portion of the material 216 may be "vaporized," for instance by scanning a laser beam across the surface of the material 200, wherein the degree of exposure may thus correlate with the degree of material removal and thus the thickness of a remaining material portion within the contact openings 223A, 223B.

Figure 2J:
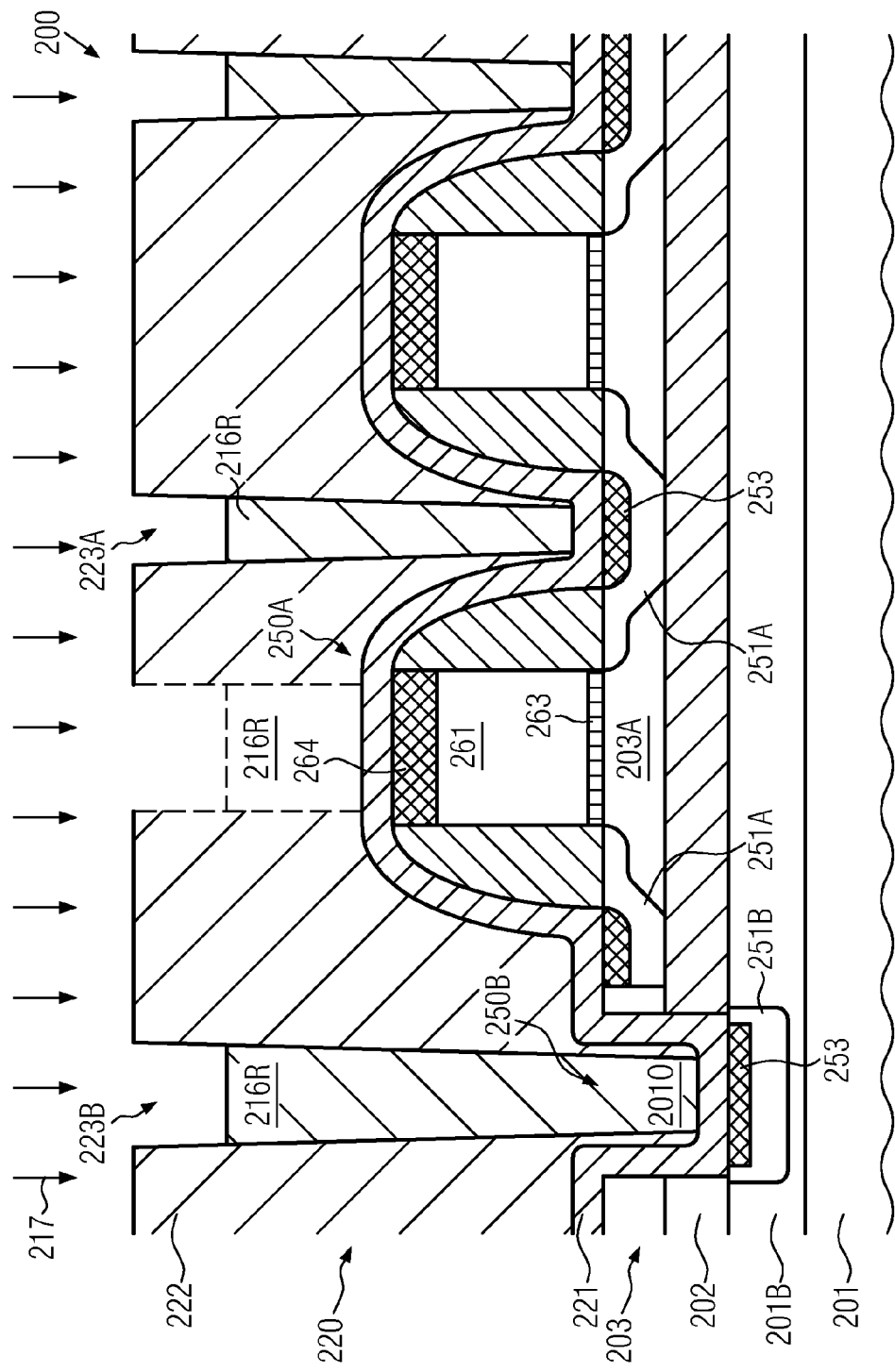

FIG. 2j schematically illustrates the device 200 during a final phase of a corresponding etch or material removal process 217, in which an excess portion of the material 216 may be removed, while still preserving and thus reliably covering any bottom areas of the contact openings 223A, 223B and 223G. Consequently, these contact openings remain filled with a sacrificial fill material 216R, i.e., the remaining portion of the previously provided material 216 (FIG. 2*i*), thereby reliably preserving integrity of the etch stop material 221, in particular in the contact opening 223B, which may typically have significantly greater lateral dimensions compared to the contact openings 223A.

Figure 2K:
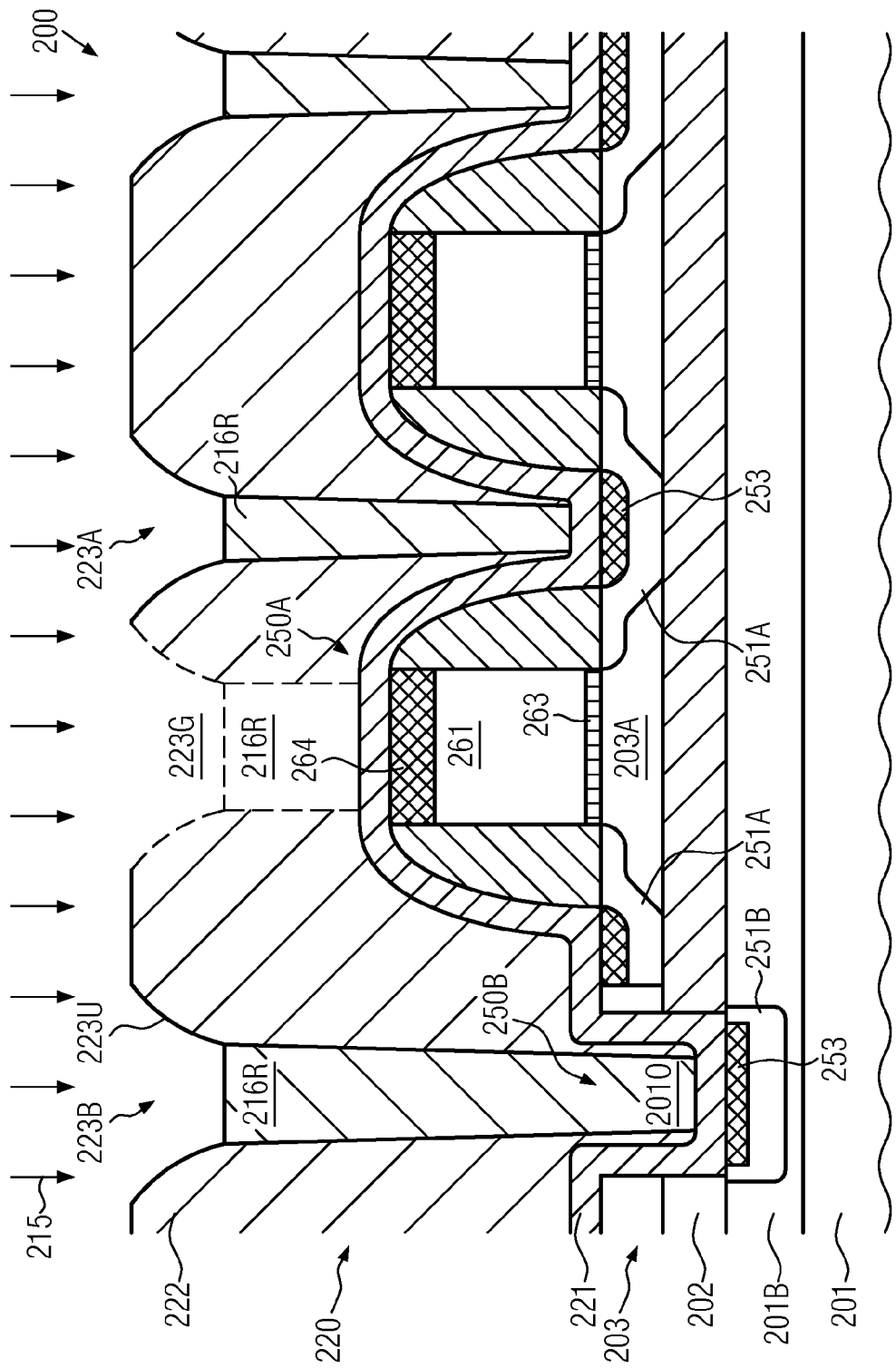
Figure 21:
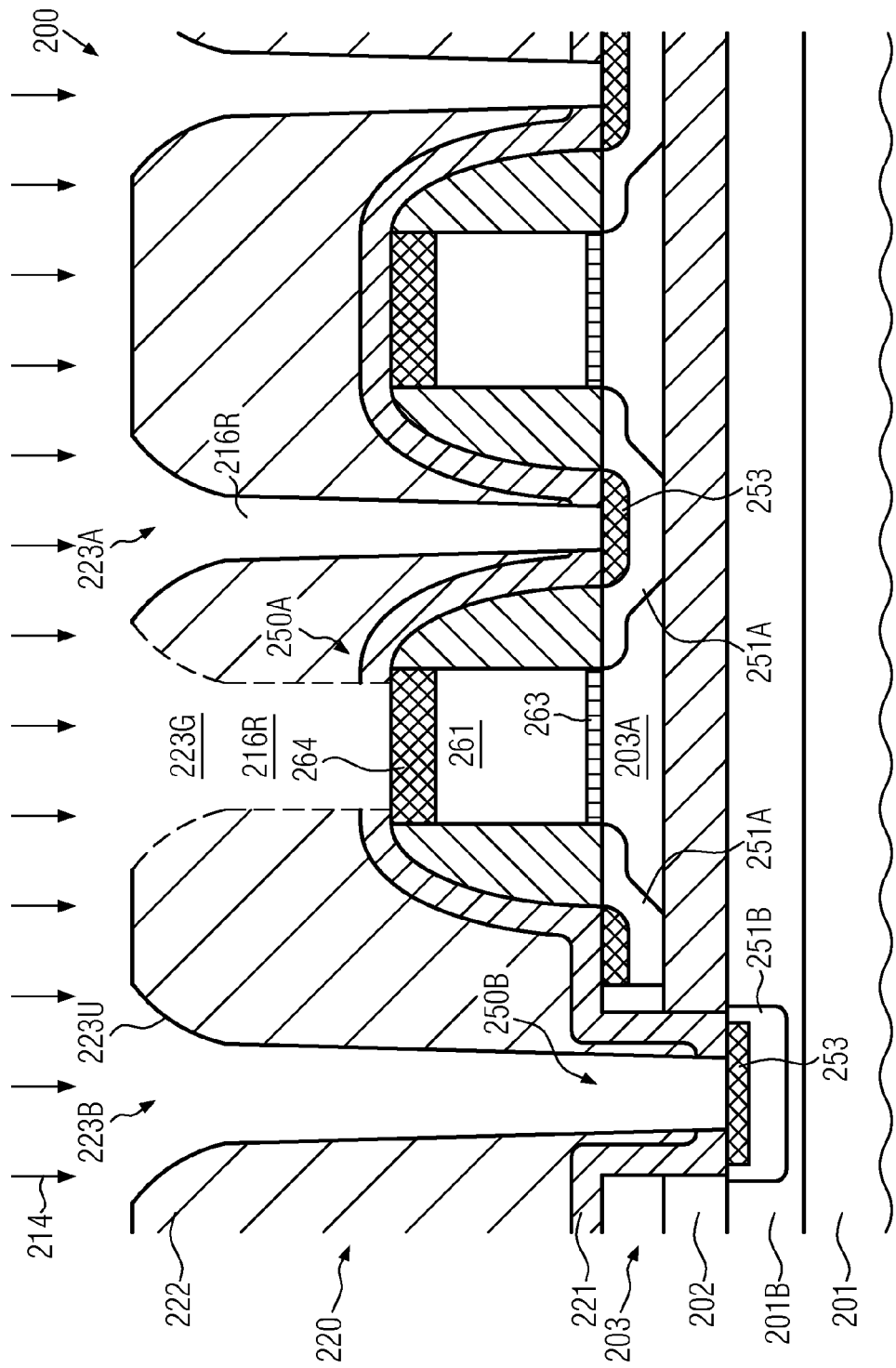

FIG. 2*k* schematically illustrates the semiconductor device 200 in a further advanced manufacturing stage in which a material removal process 215 may be applied in the presence of the sacrificial fill material 216R in order to obtain tapered or rounded upper portions 223U of the contact openings 223A, 223G and 223B. In this manner, in particular the fill conditions for the critical contact openings 223A and 223G may be enhanced with respect to the subsequent deposition of an appropriate contact material. Thus, in particular, the etch stop layer 221 and thus the metal silicide region 253 may remain substantially unaffected by the removal process 215 due to the presence of the material 216R. Thereafter, the material 216R may be removed by any wet chemical etch chemistry, plasma processes and the like in order to expose the material 221, however, without unduly affecting the underlying material 253.

FIG. 2*l* schematically illustrates the semiconductor device 200 when exposed to a further etch process 214 that is appropriately designed so as to etch through the etch stop layer 221, thereby finally exposing a portion of the metal silicide 253 in the substrate diode 250B and in the transistors 250A. Due to the superior integrity of the material 221, highly uniform process conditions may be encountered during the process 214, thereby enabling the etching of the material 221 in a highly controlled manner without requiring any significant over-etch time. Consequently, the metal silicide materials 253 may be exposed with superior process uniformity since any undue exposure to any reactive process atmospheres during the preceding manufacturing flow may be avoided. Consequently, superior integrity of a critical area in the substrate diode 250B may be achieved.

Thereafter, the further processing may be continued by depositing a contact material, such as tungsten in combination with appropriate barrier materials, or any other appropriate contact material, wherein the tapered cross-sectional shape of the contact openings 223A and 223G may provide superior fill efficiency and uniformity.

As a result, the present disclosure provides manufacturing techniques and semiconductor devices in which superior substrate diode characteristics may be achieved by providing an increased lateral resistance between a metal silicide and a PN junction and/or by preserving superior integrity of the metal silicide material during the patterning of contact openings, in particular when a tapered upper portion thereof is to be provided. In some illustrative embodiments, the process sequence for forming a sidewall spacer element in the substrate opening may be advantageously combined with the usage of a sacrificial fill material upon patterning the contact openings, thereby providing even further enhanced process robustness, while not unduly contributing to overall process complexity. In particular, any of the above-described process strategies may be implemented without requiring additional lithography steps to be performed on the basis of dedicated lithography masks.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming an opening through a region of a semiconductor layer and a buried insulating layer of an SOI device so as to expose a portion of a crystalline substrate material of said SOI device;
    performing an implantation process so as to form a doped region in said exposed portion of said crystalline substrate material and to form drain and source regions of a transistor formed in and above a semiconductor region of said semiconductor layer;
    forming a liner in said opening and above said transistor;
    forming a sacrificial fill material selectively in said opening;
    removing said liner outside of said opening by using said sacrificial fill material as an etch mask; and
    forming a metal silicide in said doped region and said drain and source regions.

2. The method of claim 1, wherein forming said sacrificial fill material selectively in said opening comprises depositing a fill material layer and performing a removal process so as to preserve a portion of said fill material layer in said opening.

3. The method of claim 2, wherein said sacrificial fill material is deposited in a low viscous state.

4. The method of claim 3, further comprising exposing said sacrificial fill material to radiation so as to induce a photochemical reaction prior to performing said removal process.

5. The method of claim 2, wherein removing said liner outside of said opening comprises performing a plasma assisted etch process to remove a portion of said sacrificial fill material prior to forming said fill material layer.

6. The method of claim 5, wherein performing said plasma assisted etch process is controlled so as to preserve a thinned layer portion of said liner at a bottom of said opening.

7. The method of claim 6, further comprising performing a cleaning process so as to expose said crystalline substrate material while preserving at least a portion of said liner on sidewalls of said opening.

8. The method of claim 1, further comprising forming a dielectric material above said opening and said transistor and forming a first contact opening and a second contact opening in said dielectric material, wherein said first contact opening connects to said metal silicide in said crystalline substrate material and said second contact opening connects to said metal silicide in one of said drain region and said source region.

9. The method of claim 8, further comprising performing a treatment so as to round upper portions of said first and second contact openings.

10. The method of claim 9, further comprising forming a second sacrificial fill material selectively in said first and second contact openings prior to performing said treatment.

11. A method, comprising:
    forming an interlayer dielectric material in and above a substrate opening and a transistor, said substrate opening being formed in a semiconductor layer and a buried insulating layer of an SOI device and connecting to a crystalline substrate material, said transistor being formed in and above a semiconductor region in said semiconductor layer;
    forming a first contact opening and a second contact opening in said interlayer dielectric material, said first contact opening extending into said substrate opening without exposing a metal silicide region formed in said crystalline substrate material, said second contact opening being aligned to one of said drain and source regions;

forming a sacrificial fill material in said first and second contact openings; and performing a material removal process so as to round an upper portion of said first and second contact openings in the presence of said sacrificial fill material.

12. The method of claim 11, further comprising removing said sacrificial fill material and performing an etch process so as to expose said metal silicides in said first and second contact openings.

13. The method of claim 12, wherein forming said sacrificial fill material comprises depositing a fill layer in a low viscous state and removing an excess portion of said fill layer.

14. The method of claim 13, further comprising exposing said fill layer to radiation prior to removing said excess portion thereof.

15. The method of claim 11, further comprising performing an implantation process so as to form a doped region in said crystalline substrate material based on said substrate opening and to form drain and source regions of said transistor.

16. The method of claim 15, further comprising forming a spacer on sidewalls of said substrate opening after performing said implantation process.

17. The method of claim 16, wherein forming said spacer comprises forming a liner in said substrate opening and above said transistor, forming a second sacrificial fill material selectively in said substrate opening and removing at least a portion of said liner in the presence of said second sacrificial fill material.

* * * * *